(12) United States Patent
Kim

(10) Patent No.: US 7,888,731 B2
(45) Date of Patent: Feb. 15, 2011

(54) MEMORY DEVICES AND METHODS OF FORMING AND OPERATING THE SAME

(75) Inventor: Jae-Ho Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/385,347

(22) Filed: Apr. 6, 2009

(65) Prior Publication Data

US 2009/0250745 A1 Oct. 8, 2009

(30) Foreign Application Priority Data

Apr. 7, 2008 (KR) ...................... 10-2008-0032304

(51) Int. Cl.
*H01L 29/792* (2006.01)

(52) U.S. Cl. ................. 257/324; 257/314; 257/E29.309

(58) Field of Classification Search ................. 257/324, 257/314, E29.3, E29.309

See application file for complete search history.

(56) References Cited

U.S. PATENT DOCUMENTS

| 2007/0034929 A1 | 2/2007 | Hwang et al. |
| 2007/0158731 A1 | 7/2007 | Bae et al. |
| 2008/0067573 A1* | 3/2008 | Jang et al. ................... 257/315 |

FOREIGN PATENT DOCUMENTS

| JP | 2003-051557 A | 2/2003 |
| JP | 2007-036173 A | 2/2007 |
| KR | 10-0632634 B1 | 9/2006 |
| KR | 10-0689842 B1 | 2/2007 |

* cited by examiner

*Primary Examiner*—Roy K Potter
(74) *Attorney, Agent, or Firm*—Lee & Morse P.C.

(57) ABSTRACT

A memory device, including a first ground selection transistor, a first string selection transistor, and first memory cell transistors disposed in series between the first ground selection transistor and the first string selection transistor, wherein the first ground selection transistor and the first memory cell transistors have a same structure. A method of programming the memory device may include programming the ground selection transistor before programming the memory cell.

7 Claims, 11 Drawing Sheets

MEMORY DEVICES AND METHODS OF FORMING AND OPERATING THE SAME

BACKGROUND

1. Field

Exemplary embodiments disclosed herein relate to memory devices which stably operate and methods of forming and operating the same.

2. Description of the Related Art

Nonvolatile memory devices are memory devices that may maintain stored data when a power supply is interrupted. A flash memory device is a typical nonvolatile memory device.

A flash memory device includes a floating gate and may electrically program and erase data. Data programming and erasing operations may be performed by injecting charges into or emitting charges from an electrically isolated floating gate. Injection of charges and emission of charges may be performed by a hot carrier injection method or a Fowler-Nordheim tunneling method. Generally, an operating voltage, e.g., a programming voltage or an erasing voltage, may be applied to a control gate electrode. Charges may be injected into a floating gate or emitted from a floating gate by a voltage induced in the floating gate by the operating voltage. As a design rule of a semiconductor device is reduced, electrical problems, e.g., leakage, may arise during programming operations.

SUMMARY

Embodiments are therefore directed to a memory device and a method of operating and a method of forming the same, which substantially overcome one or more the problems due to the limitations and disadvantages of the related art.

It is therefore a feature of an embodiment to provide a memory device including ground selection transistors and first memory cell transistors having a same structure.

It is therefore a feature of an embodiment to provide a method of programming a memory device, including ground selection transistors and first memory cell transistors having a same structure, which includes programming the ground selection transistor before programming the memory cell.

At least one of the above and other features and advantages may be realized by providing a memory device, including a first ground selection transistor, a first string selection transistor, and first memory cell transistors disposed in series between the first ground selection transistor and the first string selection transistor, wherein the first ground selection transistor and the first memory cell transistors have a same structure.

The first memory cell transistors and the first ground selection transistor may include a first gate insulating layer, a first charge storage layer, a first middle gate insulating layer and a first gate layer, respectively.

The first ground selection transistor, the first string selection transistor and the first memory cell transistors may correspond to a first memory array layer, wherein the memory device may further include a second memory array layer above the first memory array layer, the second memory array layer including a second ground selection transistor, a second string selection transistor and second memory cell transistors disposed in series between the second ground selection transistor and the second string selection transistor, and wherein the second ground selection transistor and the second string selection transistor may have a same structure.

The second memory cell transistors and the second ground selection transistor may include a second gate insulating layer, a second charge storage layer, a second middle gate insulating layer and a second gate layer.

The first string selection transistor and the second string selection transistor may include a gate insulating layer and a gate layer.

The memory device may further include a bit line electrically connected to a drain of the first string selection transistor and a drain of the second string selection transistor, the bit line being disposed above the second memory array layer, and a common source line that electrically connects a first common source region of the first ground selection transistor to a second common source region of the second ground selection transistor.

The memory device may further include a source contact connecting the first common source region and the second common source region, wherein the source contact penetrates a body of the second memory array layer.

At least one of the above and other features and advantages may be separately realized by providing a method of operating a memory device that includes a ground selection line, a string selection line, and word lines disposed in parallel between the ground selection line and the string selection line, wherein ground selection transistors connected to the ground selection line and memory cell transistors connected to the word lines have a same structure, the method including programming the ground selection transistors, and programming a selected memory cell transistor.

Programming the selected memory cell transistor may include applying a first program voltage to a selected word line associated with the selected memory cell transistor, and applying a pass voltage to the word lines besides the selected word line.

Programming the ground selection transistors may include applying a second program voltage to the ground selection line, and applying a pass voltage to the word lines.

The second program voltage may be equal to or smaller than the first program voltage.

Programming the ground selection transistors may include applying a second program voltage to the ground selection line, and applying 0V to the word lines.

The second program voltage may be equal to or smaller than the first program voltage.

The method may include simultaneously erasing data programmed in the ground selection transistors and the selected memory cell transistor.

Erasing the data may include applying 0V to the ground selection line and a word line of the selected memory cell transistor, and applying an erasing voltage to a well of a substrate of the memory device.

The memory device may include strings, each string including respective ones of the memory cell transistor disposed in series between the ground selection line and the string selection line, the method may further include boosting non-selected strings besides a selected string including the selected memory cell transistor.

Programming the ground selection transistors may include selectively programming memory cell transistors disposed at an intersection of the ground selection line and the non-selected strings.

Programming the ground selection transistors may include programming all the memory cell transistors disposed at an intersection of the ground selection line and the strings.

Programming the ground selection transistors and programming the selected memory cell transistor may be sequentially performed.

At least one of the above and other features and advantages may be realized by providing a method of forming a memory device including a ground selection line, a string selection line and word lines disposed in parallel between the ground selection line and the string selection line, the method including forming a first insulating layer on a first semiconductor layer, forming a first gate layer on the first insulating layer, forming a second insulating layer on the first gate layer, removing at least the second insulating layer to expose at least a portion of the first gate layer at a region of the first semiconductor layer associated with the string selection line, forming a second gate layer on the second insulating layer, and patterning the first insulating layer, the first gate layer, the second insulating layer and the second gate layer to form a plurality of gate stacks having a first structure and a gate stack having a second structure, the first structure being different from the second structure and the gate stack having the second structure being associated with the string selection line.

BRIEF DESCRIPTION OF THE DRAWINGS

The above and other features and advantages will become more apparent to those of ordinary skill in the art by describing in detail exemplary embodiments thereof with reference to the attached drawings, in which.

DETAILED DESCRIPTION

Korean Patent Application No. 2008-0032304, filed on Apr. 7, 2008, in the Korean Intellectual Property Office, and entitled: "Memory Devices and Methods of Operating the Same," is incorporated by reference herein in its entirety.

Exemplary embodiments will now be described more fully hereinafter with reference to the accompanying drawings; however, aspects of the invention may be embodied in different forms and should not be construed as limited to the embodiments set forth herein. Rather, these embodiments are provided so that this disclosure will be thorough and complete, and will fully convey the scope of the invention to those skilled in the art.

Figure 1:
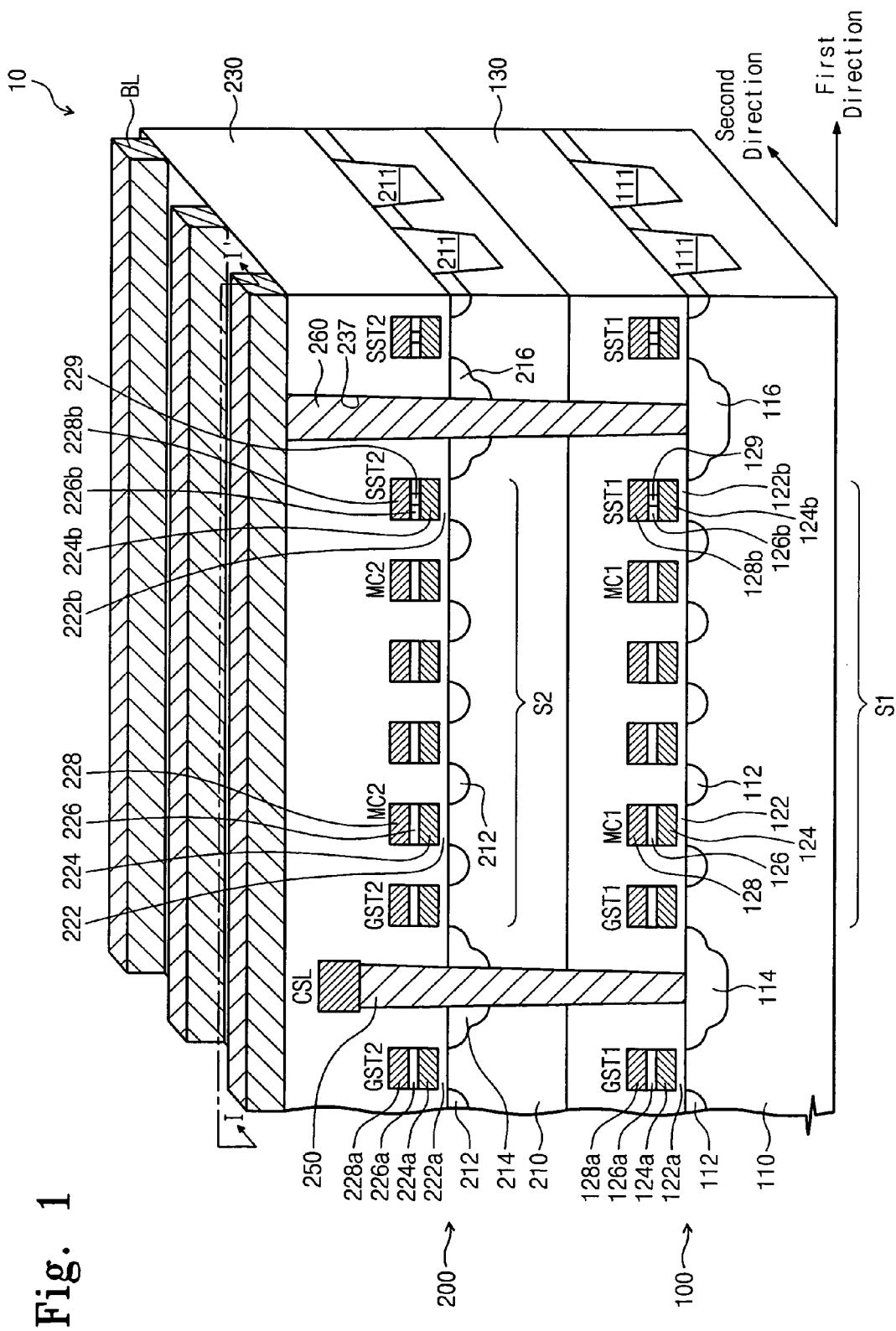
FIG. 1 illustrates a perspective view of an exemplary embodiment of a memory device.
Figure 2:
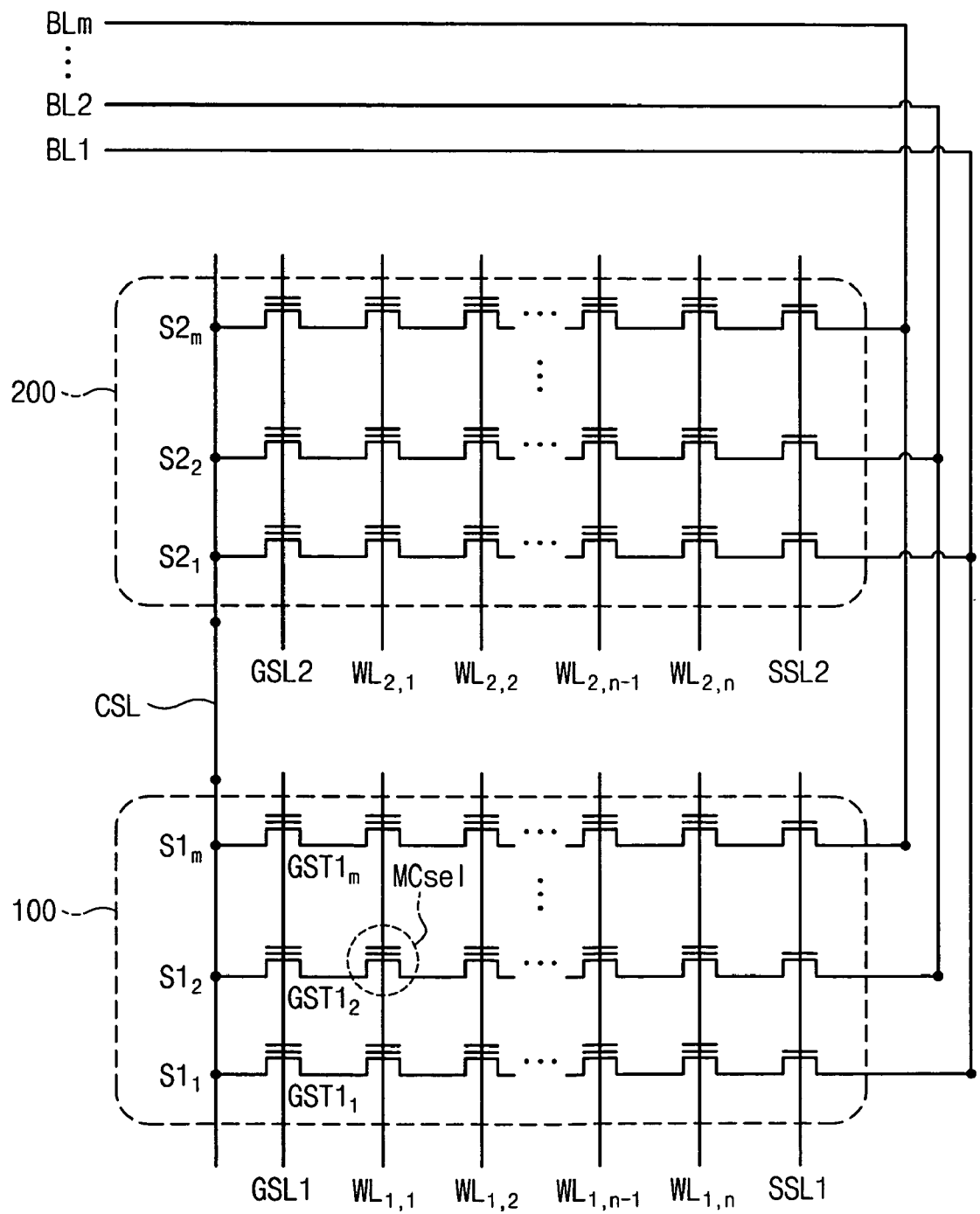
FIG. 2 illustrates a circuit diagram of the exemplary memory device of FIG. 1.

FIG. 1 illustrates a perspective view of an exemplary embodiment of a memory device 10, e.g., a flash memory device. FIG. 2 illustrates a circuit diagram of the exemplary memory device 10 of FIG. 1.

Referring to FIG. 1, the memory device 10, e.g., the flash memory device, may include a first memory array layer 100 and a second memory layer 200. The first memory array layer 100 and the second memory array layer 200 may be stacked. The first memory array layer 100 and the second memory layer 200 may have a same structure.

Referring to FIGS. 1 and 2, the first memory array layer 100 may include a first semiconductor layer 110 as a body. The first semiconductor layer 110 may include active regions that are defined by a device isolation layer 111 and extend in a first direction. The first memory array layer 100 may include a first NAND string (S1) extending in the first direction on the active region of the first semiconductor layer 110. The first NAND string (S1) may include a first ground selection transistor (GST1), a first string selection transistor (SST1) and a first cell string including first memory cell transistors (MC1) disposed in series between the first ground selection transistor (GST1) and the first string selection transistor (SST1). The first NAND string (S1) may be repeatedly disposed on the first semiconductor layer 110. The first NAND strings (S1) may be symmetrically disposed in a mirror-image arrangement so as to improve device integration.

The second memory array layer 200 may include a second semiconductor layer 210. The second semiconductor layer 210 may include active regions that are defined by a device isolation layer 211 and extend in the first direction. The second memory array layer 200 may include a second NAND string (S2) extending in the first direction on the active region of the second semiconductor layer 210. The second NAND string (S2) may include a second ground selection transistor (GST2), a second string selection transistor (SST2) and a second cell string including second memory cell transistors (MC2) disposed in series between the second ground selection transistor (GST2) and the second string selection transistor (SST2).

The first memory cell transistors (MC1) and the first ground selection transistor (GST1) may have a same structure.

The first memory cell transistors (MC1) may include a first gate insulating layer 122, a first charge storage layer 124, a first middle gate insulating layer 126 and a first gate layer 128 that are sequentially stacked, respectively. In the first memory cell transistors (MC1), the first charge storage layer 124 may be used may be used as a gate of a floating type or a charge trap type. The first gate layer 128 may be used as a control gate.

The first ground selection transistor (GST1) may include a first ground selection gate insulating layer 122a, a first ground selection charge storage layer 124a, a first ground selection middle gate insulating layer 126a and a first ground selection gate layer 128a. The layers of the first ground selection transistor (GST1) may be sequentially stacked.

The first string selection transistor (SST1) may include the same layers as the first ground selection transistor (GST1). More particularly, e.g., the first string selection transistor (SST1) may include a first string selection gate insulating layer 122b, a first string selection lower gate layer 124b, a first string selection middle gate insulating layer 126b and a first string selection upper gate layer 128b.

The first string selection transistor (SST1) may further include a first butting contact 129 that electrically connects the first string selection lower gate layer 124b and the first string selection upper gate layer 128b. Also, in the first string selection transistor (SST1), the first string selection lower gate layer 124b may be directly in contact with the first string selection upper gate layer 128b by removing the first string selection middle gate insulating layer 126b. That is, the first string selection lower gate layer 124b and the first string selection upper gate layer 128b may constitute a same gate layer.

The second memory cell transistors (MC2) may include a second gate insulating layer 222, a second charge storage layer 224, a second middle gate insulating layer 226 and a second gate layer 228.

The second ground selection transistor (GST2) may include a second ground selection gate insulating layer 222a, a second ground selection charge storage layer 224a, a second ground selection middle gate insulating layer 226a and a second ground selection gate layer 228a.

The second string selection transistor (SST2) may include a second string selection gate insulating layer 222b, a second string selection lower gate layer 224b, a second string selection middle gate insulating layer 226b, a second string selection upper gate layer 228b and a second butting contact 229. The second charge storage layer 224 and the second ground selection charge storage layer 224a may be used as a gate of a floating type or a charge trap type. The second gate layer 228 and the second ground selection gate layer 228a may be used, e.g., as a control gate.

Referring to FIGS. 1 and 2, first word lines ($WL_{1,1}$, $WL_{1,2}, \ldots WL_{1,n}$) may extend in a second direction crossing the first direction. The first gate layers 128 of the first memory cell transistors (MC1) extending in a direction crossing the first NAND string (S1) may constitute the first word lines ($WL_{1,1}, WL_{1,2}, \ldots WL_{1,n}$). The first ground selection gate layer 128a of the first ground selection transistor (GST1) may constitute a first ground selection line (GSL1). The first ground selection gate layer 128a may be disposed parallel to the first word lines ($WL_{1,1}, WL_{1,2}, \ldots WL_{1,n}$) on one side of the first word lines ($WL_{1,1}, WL_{1,2}, \ldots WL_{1,n}$). The first string selection upper gate layer 128b of the first string selection transistor (SST1) may be disposed on the other side of the first word lines ($WL_{1,1}, WL_{1,2}, \ldots WL_{1,n}$) and may constitute a first string selection line (SSL).

Similar to the first memory array layer 100, the second memory array layer 200 may include second word lines ($WL_{2,1}, WL_{2,2}, \ldots WL_{2,n}$), a second ground selection line (GSL2) and a second string selection line (SSL2).

Each of the memory cell transistors (MC1) may include an impurity diffusion region 112. Adjacent ones of the first memory cell transistors (MC1) in a same first NAND string (S1) may share respective ones of the impurity diffusion regions 112. A first common source region 114 may be disposed in the semiconductor layer 110 between the adjacent first ground selection transistors (GST1). The first NAND strings (S1) may be symmetrically disposed in a mirror image arrangement with respect to the first common source region 114. A first drain region 116 may be disposed in the first semiconductor layer 110 adjacent to the first string selection transistor (SST1). Like the first memory array layer 100, the second memory array layer 200 may include impurity diffusion regions 212, a second common source region 214 and a second drain region 216.

A first insulating interlayer 130 may be disposed between the first memory array layer 100 and the second memory array layer 200. A second insulating interlayer 230 may be provided on the second memory array layer 200.

The first common source region 114 and the second common source region 214 may be electrically connected to each other by a source contact 250. The source contact 250 may penetrate the second semiconductor layer 210, which may correspond to a body of the second memory array layer 200, and the first insulating interlayer 130. The source contact 250 may electrically connect the second common source region 214 and the first common source region 114. That is, the source contact 250 may be electrically connected to a P-well region of the second semiconductor layer 210.

A common source line (CSL) may be connected to the source contact 250 to connect the common source regions 114 and 214. The common source line (CSL) may extend in the second direction. The common source line (CSL) may extend in the second insulating interlayer 230.

A bit line (BL) may extend in the first direction on the second insulating interlayer 230. The bit line (BL) may be electrically connected to the first drain region 116 and the second drain region 216 by a bit line contact 260. The bit line contact 260 may penetrate the second insulating interlayer 230, the second semiconductor layer 210 and the first insulating interlayer 130. As shown in FIG. 2, drain regions 116, 216 of the NAND strings disposed in parallel to each other in each of the semiconductor layers 110, 210 may be connected to a different bit line (BL), respectively.

Referring to FIGS. 1 and 3 through 8, an exemplary method of forming a memory device 10 of FIG. 1 will be described. FIGS. 3, 4, 5, 6, 7 and 8 illustrate cross-sectional views of stages in an exemplary method of forming the exemplary memory device 10 of FIG. 1, taken along line I-I' of FIG. 1.

Figure 3:
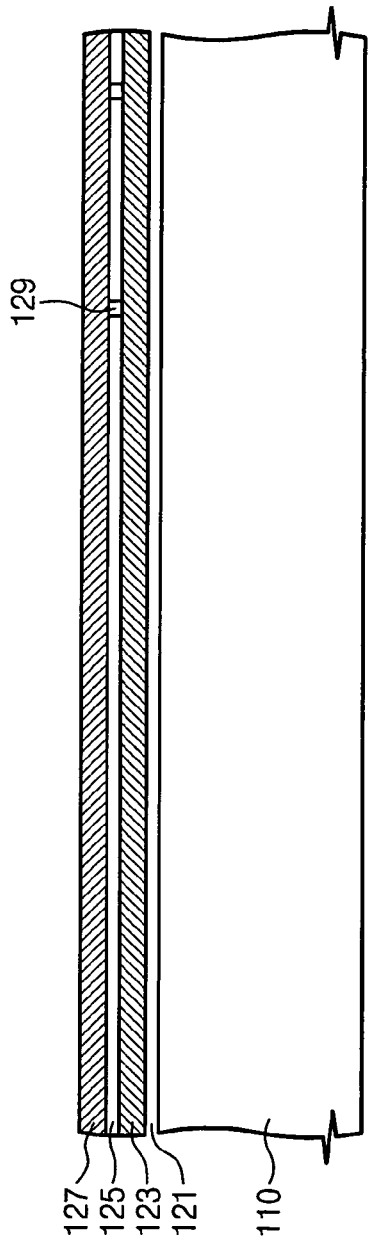
FIGS. 3, 4, 5, 6, 7 and 8 illustrate cross-sectional views of stages in an exemplary method of forming the exemplary memory device of FIG. 1, taken along line I-I' of FIG. 1.

Referring to FIGS. 1 and 3, a first semiconductor layer 110 may be provided. The first semiconductor layer 110 may be defined by a device isolation layer 111 (FIG. 1) and may include active regions extending in a first direction. A first insulating layer 121, a first gate layer 123, a second insulating layer 125 and a second gate layer 127 may be formed on the first semiconductor layer 110. The first insulating layer 121 may include a silicon oxide layer. The second insulating layer 125 may include a silicon oxide layer, a silicon nitride and/or a silicon oxide layer. The second insulating layer 125 may include a high dielectric material. The first gate layer 123 may include a conductive polysilicon or a high dielectric material. The first gate layer 123 may extend in the first direction on the active region. The second gate layer 127 may include a conductive polysilicon, metal, a metal silicide and/or a conductive metal nitride.

In a region where a string selection line (SSL) is formed, before forming the second gate layer 127, an etching process may be selectively applied to the second insulating layer 125 to form a butting region (not shown) exposing the first gate layer 123. The second gate layer 127 may be formed on the second insulating layer 125 to form a butting contact 129 filling the butting region. In some embodiments, in the region where the string selection line (SSL) is formed, the second insulating layer 125 may be selectively removed. The first and second gate layers 125 and 127 may be directly in contact with each other and stacked.

Figure 4:
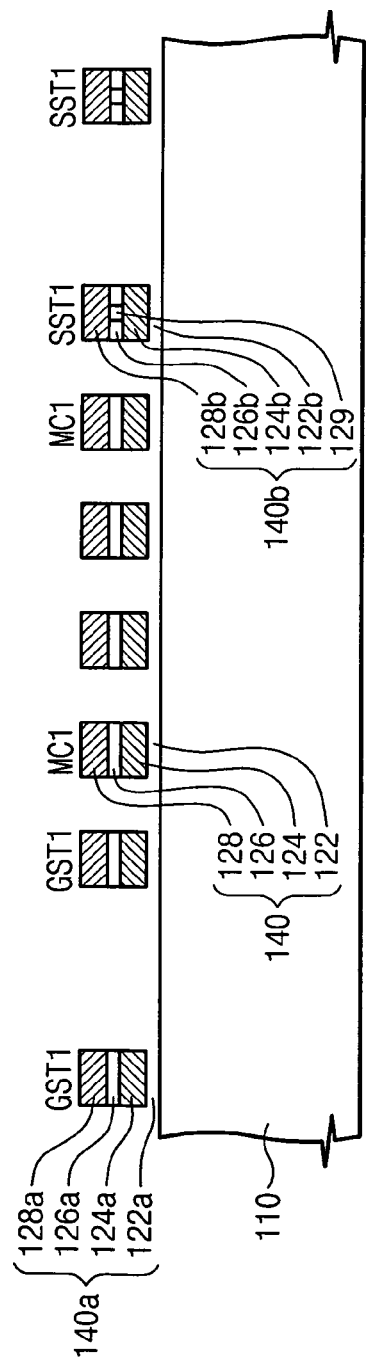

Referring to FIGS. 1 and 4, the second gate layer 127, the second insulating layer 125, the first gate layer 123 and the first insulating layer 121 may be patterned to form a first ground selection gate stacked 140a and a first memory cell gate stack 140. The first memory cell gate stack 140 may include a first gate insulating layer 122, a first charge storage layer 124, a first middle gate insulating layer 126, and a first gate layer 128. The first ground cell gate stack 140a may include a first ground selection gate insulating layer 122a, a first ground selection charge storage layer 124a, a first ground selection middle gate insulating layer 126a and a first ground selection gate layer 128a.

A first string selection gate stack 140b and the first memory cell gate stack 140 may be simultaneously and/or substantially simultaneously formed. The first string selection gate stack 140b may include a first string selection gate insulating layer 122b, a first string selection lower gate layer 124b, a first string selection middle gate insulating layer 126b and a first string selection upper gate layer 128b. The first string selection gate stack 140b may further include a first butting contact 129 that electrically connects the first string selection lower gate layer 124b to the first string selection upper gate layer 128b. During formation of the first string selection gate stack 140*b*, respective portions of the first ground selection gate stack 140*a* and the first memory cell gate stack 140 may be covered using a mask pattern. For example, respective portions of the memory cell gate stack 140 and the first ground selection gate stack 140*a* that have been formed may be covered using a mask pattern during, removal of the second insulating layer 125 to form the butting contact 129. Alternatively, the first string selection gate stack 140*b* may include the first string selection gate insulating layer 122*b* and the first string selection gate layer 124*b* or 128*b* directly contacting each other. During formation of the first string selection gate stack 140*b*, respective portions of the first ground selection gate stack 140*a* and the first memory cell gate stack 140 may be covered using a mask pattern. For example, respective portions of the memory cell gate stack 140 and the first ground selection gate stack 140*a* that have been formed may be covered using a mask pattern during removal of stacks on a region for the string selection line (SSL) and sequentially stacking the first string selection gate insulating layer 122*b* and the first string selection gate layer 124*b* or 128*b* on the region for string selection line (SSL).

Figure 5:
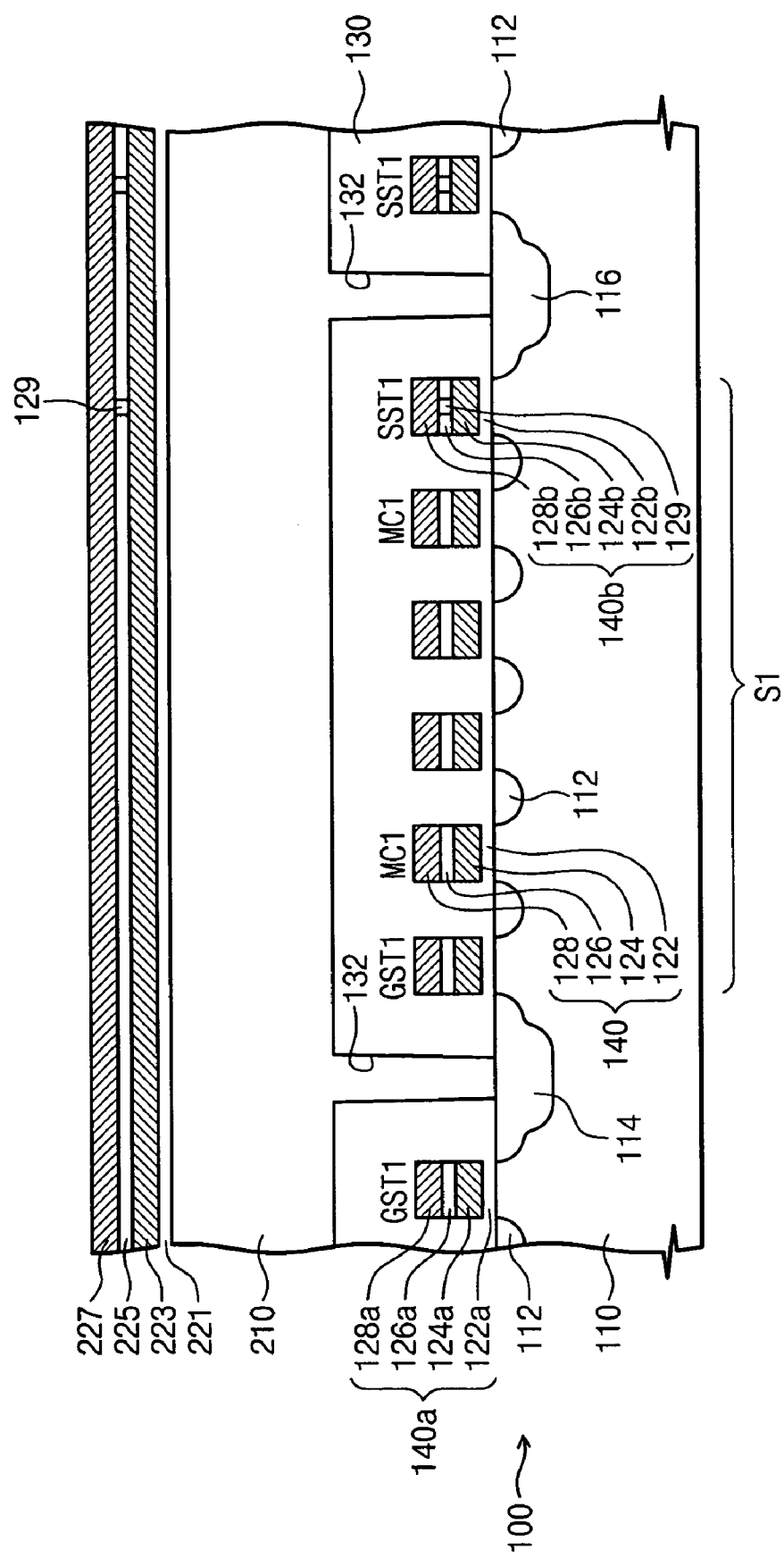

Referring to FIGS. 1 and 5, after forming the gate stacks, an ion implantation process or an annealing process may be performed. Impurity diffusion regions 112 may be formed in the active regions on sides of the first memory cell gate stacks 140 and a first common source region 114 may be formed in the active region on sides of the first ground selection gate stack 140*a*. A first drain region 116 may be formed in the active region on sides of the first string selection gate stack 140*b*. The gate stacks 140, 140*a*, 140*b* may further include a protective layer on top surfaces of the gate stacks and may further include gate spacers (not shown) on sidewalls of the gate stacks. An ion implantation process may be applied to the first common source region 114 and the first drain region 116 using the gate spacers. The first common source region 114 and the first drain region 116 may have an impurity concentration higher than the impurity diffusion region 112 to improve a contact resistance.

A first memory array layer 100 may include the first semiconductor layer 110 and a first NAND string (S1) extending in the first direction on the first semiconductor layer 110. The first NAND string (S1) may include a first ground selection transistor (GST1), a first string selection transistor (SST1), first memory cell transistors (MC1) disposed in series between the first ground selection transistor (GST1) and the first string selection transistor (SST1). The first NAND string (S1) may be repeatedly disposed on the first semiconductor layer 110. The first NAND strings (S1) may be symmetrically disposed in a mirror-image arrangement to improve device integration.

Each of the first cell transistors (MC1) may include the first memory cell gate stack 140 and the impurity diffusion region 112. Each of the first ground selection transistors (GST1) may include the first ground selection gate stack 140*a* and the first common source region 114. Each of the first string selection transistors (SST1) may include the first ground selection gate stack 140*b* and the first drain region 116.

A first insulating interlayer 130 may be formed on the first memory array layer 100. The first insulating interlayer 130 may include silicon oxide. The first insulating interlayer 130 may be selectively patterned to form openings 132 that expose the first common source region 114 and the first drain region 116. An epitaxial layer may be grown using portions of the first semiconductor layer 110 exposed by the openings 132 as a seed. A second semiconductor layer 210 filling the openings 132 may be formed on the first insulating interlayer 130 using, e.g., the selective epitaxial growth (SEG) process. A planarization process may be applied to the second semiconductor layer 210.

Active regions that are defined by a device isolation layer 211 and extend in the first direction may be formed on the second semiconductor layer 210. A third insulating layer 221, a third gate layer 223, a fourth insulating layer 225 and a fourth gate layer 227 may be formed on the semiconductor layer 210. The third insulating layer 221 may include a silicon oxide layer. The fourth insulating layer 225 may include a silicon oxide layer, a silicon nitride layer and/or a silicon oxide layer. The fourth insulating layer 225 may include a high dielectric material. The third gate layer 223 may include conductive polysilicon or high dielectric material. The third gate layer 223 may extend in the first direction on the active region. The fourth gate layer 227 may include conductive polysilicon, metal, metal silicide and/or conductive metal nitride. At this time, a butting process may be performed to form a second butting contact.

Figure 6:
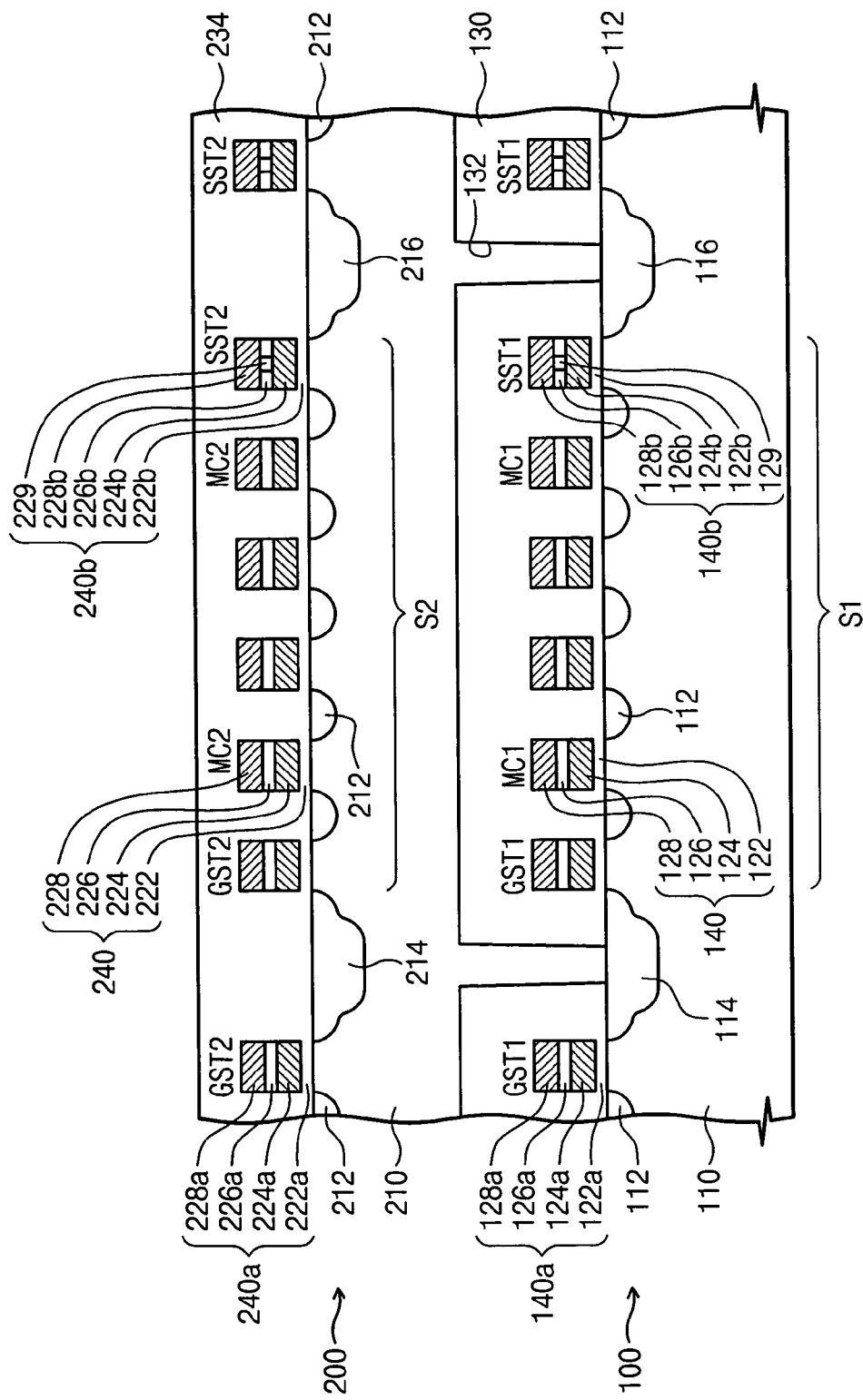

Referring to FIGS. 1 and 6, the fourth gate layer 227, the fourth insulating layer 225, the third gate layer 223 and the third insulating layer 221 may be patterned to form a second ground selection gate stack 240*a* and a second memory cell gate stack 240.

The second memory cell gate stack 240 may include a second gate insulating layer 222, a second charge storage layer 224, a second middle gate insulating layer 226 and a second gate layer 228.

The second ground selection gate stack 240*a* may include a second ground selection gate insulating layer 222*a*, a second ground selection charge storage layer 224*a*, a second ground selection middle gate insulating layer 226*a* and a second ground selection gate layer 228*a*.

A second string selection gate stack 240*b* may be formed by the same method as the first string selection gate stack 140*b*. The second string selection gate stack 240*b* may include a second string selection gate insulating layer 222*b*, a second string selection lower gate layer 224*b*, a second string selection middle gate insulating layer 226*b* and a second string selection upper gate layer 228*b*. The second string selection gate stack 240*b* may further include a butting contact 229 that electrically connects the second string selection lower gate layer 224*b* and the second string selection upper gate layer 228*b*.

Like the process of forming the first memory array layer 100, after forming the gate stacks 240, 240*a*, 240*b*, an ion implantation process and an annealing process may be performed. Impurity diffusion regions 212 may be formed in the active regions on sides of the second memory cell gate stacks 240 and a second common source region 214 may be formed in the active region on sides of the second ground selection gate stack 240*a*. A second drain region 216 may be formed in the active region on sides of the second string selection gate stack 240*b*.

The gate stacks may further include a protective layer on top surfaces of the gate stacks and may further include gate spacers (not shown) on sidewalls of the gate stacks. An ion implantation process may be applied to the second common source region 214 and the second drain region 216 using the spacer. The second common source region 214 and the second drain region 216 may have an impurity concentration higher than the impurity diffusion region 212 to improve a contact resistance.

A second memory array layer 200 may include the second semiconductor layer 210 and a second NAND string (S2) extending in the first direction on the second semiconductor layer 210. The second NAND string (S2) may include a second ground selection transistor (GST2), a second string selection transistor (SST2), second memory cell transistors (MC2) disposed in series between the second ground selection transistor (GST2) and the second string selection transistor (SST2). The second NAND string (S2) may be repeatedly disposed on the second semiconductor layer 210. The second NAND strings (S2) may be symmetrically disposed in a mirror-image arrangement to improve device integration.

Each of the second cell transistors (MC2) may include the second memory cell gate stack 240 and the impurity diffusion region 212. Each of the second ground selection transistors (GST2) may include the second ground selection gate stack 240a and the second common source region 214. Each of the second string selection transistor (SST2) may include the second ground selection gate stack 240b and the second drain region 216.

A second lower insulating interlayer 234 may be formed on the second memory array layer 200. The second lower insulating interlayer 234 may include silicon oxide.

Figure 7:
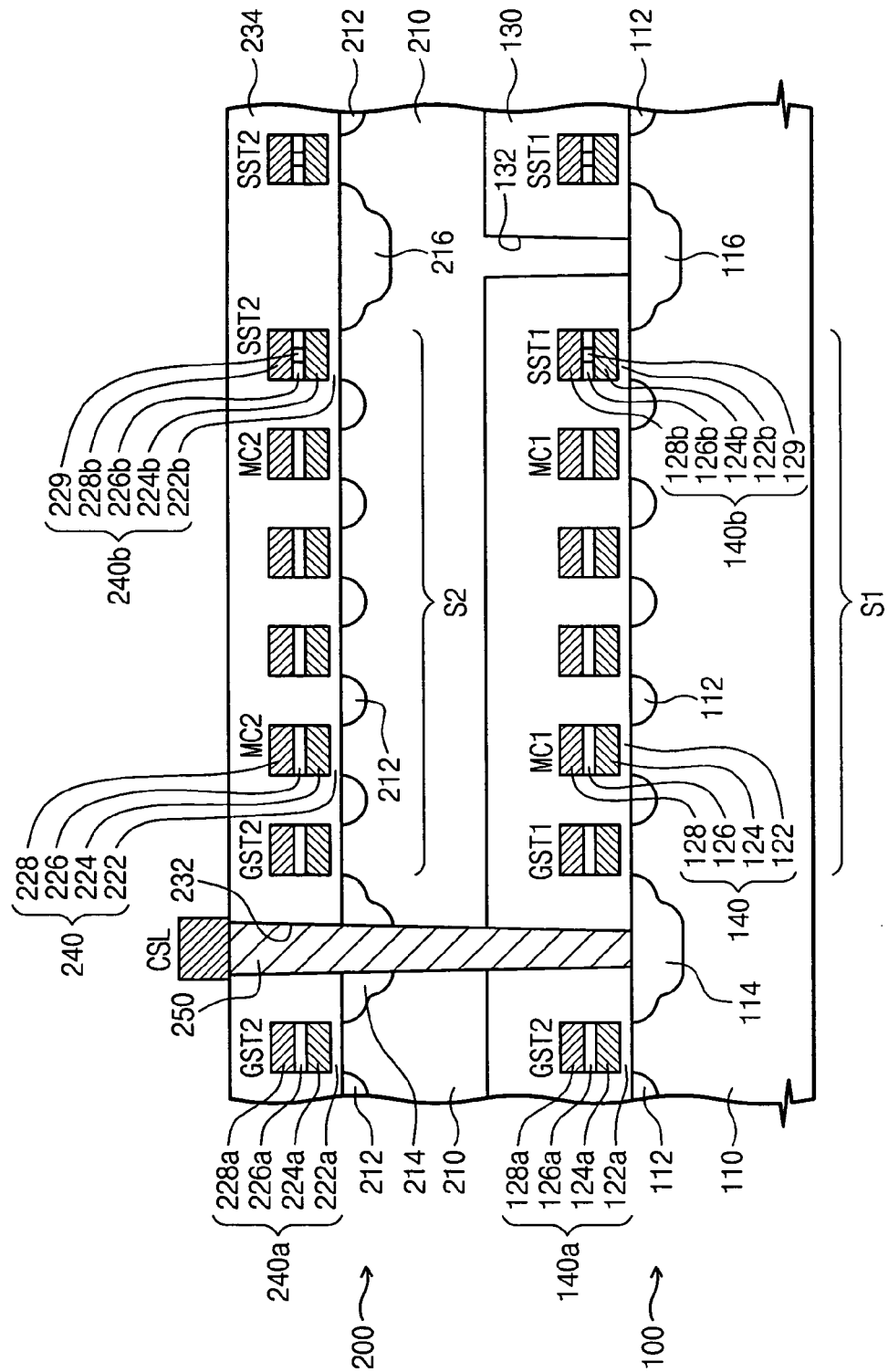

Referring to FIGS. 1 and 7, the second lower insulating interlayer 234, the second semiconductor layer 210, which may correspond to a body of the second memory array layer 200, and the first insulating interlayer 130 may be patterned to form a source contact opening 232 exposing the second common source region 214 and the first common source region 114. The source contact opening 232 may be filled with a conductive material to form a source contact 250 that electrically connects the second common source region 214 to the first common source region 114. The source contact 250 may be adjacent to a P-well of the second semiconductor layer 210. A common source line (CSL) extending in the second direction may be formed on the source contact 250. The common source line (CSL) and the source contact 250 may be simultaneously and/or substantially simultaneously formed.

Figure 8:
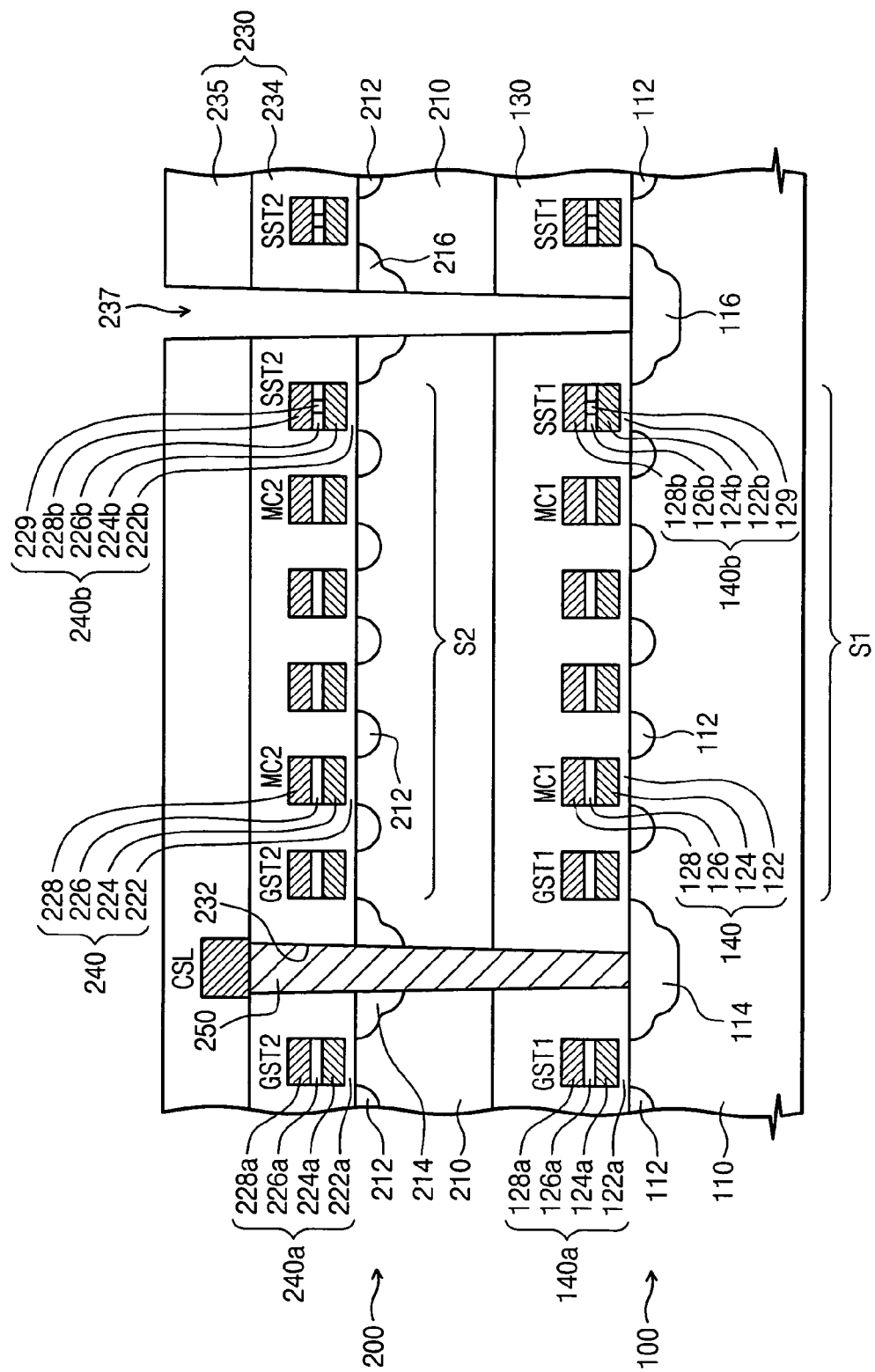

Referring to FIGS. 1 and 8, a second upper insulating interlayer 235 may be formed on the second lower insulating interlayer 234 and the source contact 250. The second upper insulating interlayer 235, the second lower insulating interlayer 234, the second semiconductor layer 210 and the first insulating interlayer 130 may be patterned to form a bit line contact hole 237 exposing the second drain region 216 and the first drain region 116.

Referring to FIG. 1, after a conductive layer may be formed on the second upper insulating interlayer 235 so as to fill the bit line contact hole 237, the conductive layer may be patterned to form a bit line contact 260 and a bit line (BL). The bit line (BL) may also be formed by an additional process after forming the bit line contact 260.

Besides the exemplary methods described above, e.g., the first memory array layer and the second memory array layer may be formed using various methods. For example, the semiconductor layers on the memory array layers need not be formed using an epitaxial growth, the semiconductor layers on the memory array layers may be formed using, e.g., an annealing process after depositing amorphous silicon, etc. Also, e.g., memory array layers that are stacked may be formed by bonding different semiconductor layers.

Figure 9:
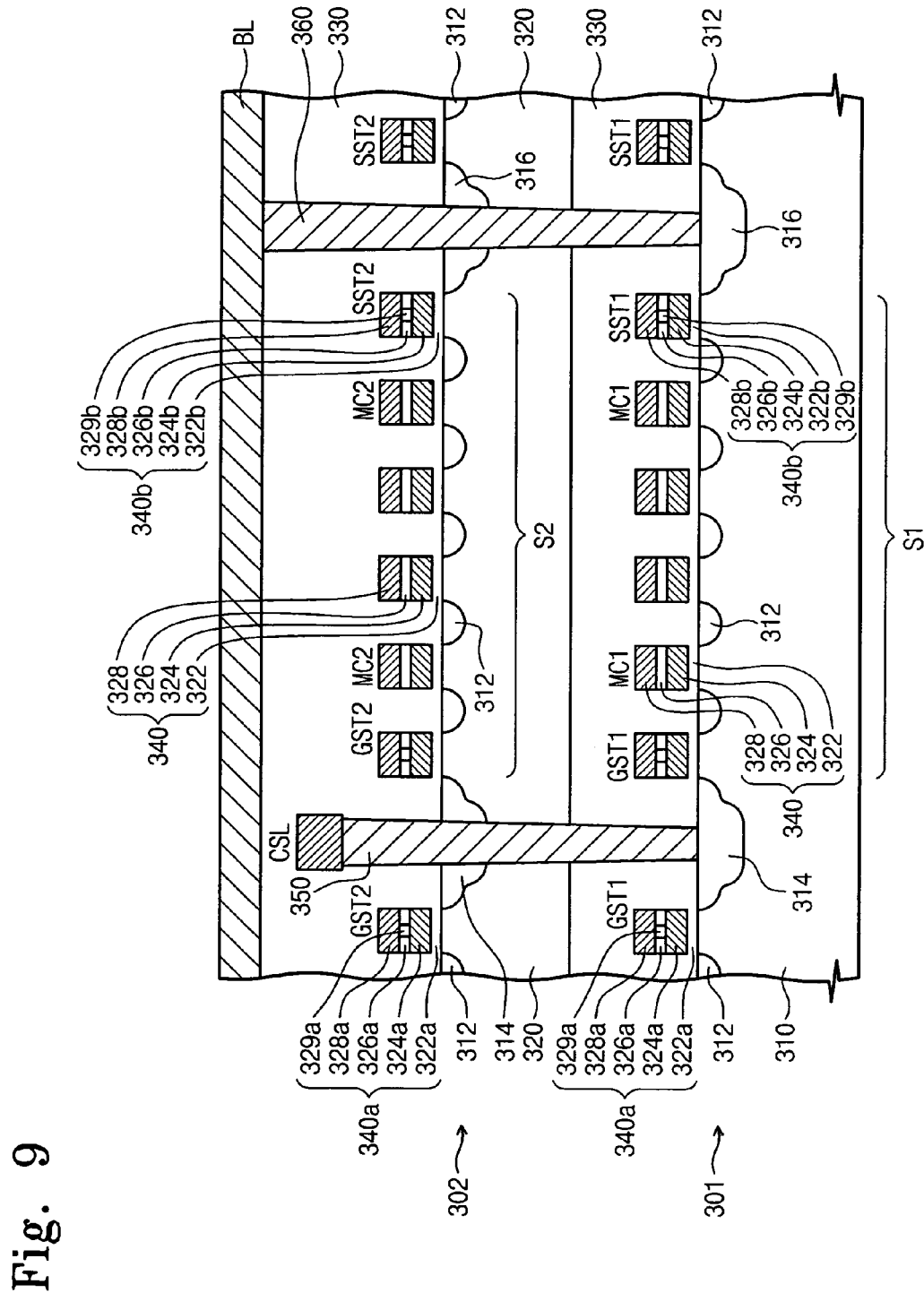
FIG. 9 illustrates a cross-sectional view of a comparative example of a memory device.
Figure 10:
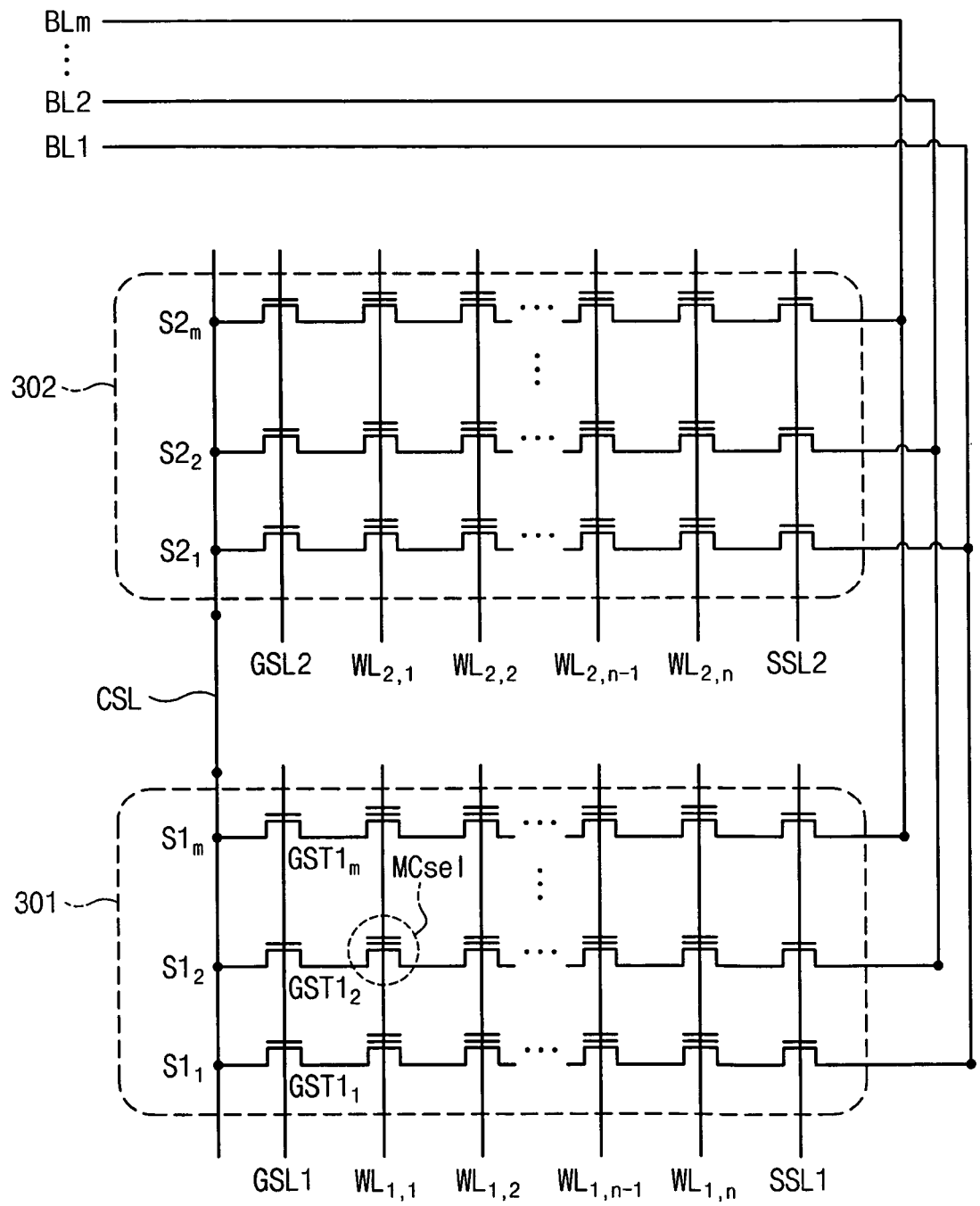
FIG. 10 illustrates a circuit diagram of the memory device of FIG. 9.

FIG. 9 illustrates a cross-sectional view of a comparative example of a memory device. FIG. 10 illustrates a circuit diagram of the memory device of FIG. 9.

A memory device according to a comparative example may include a first memory array layer 301 and a second memory array layer 302. The first memory array layer 301 may include a first semiconductor layer 310 and the second memory array layer 302 may include a second semiconductor layer 320.

In the memory device according to a comparative example, memory cell transistors (MC1, MC2) may have a different structure from ground selection transistors (GST1, GST2) and string selection transistors (SST1, SST2). The ground selection transistors (GST1, GST2) and string selection transistors (SST1, SST2) may have a same structure.

Each of the memory cell transistors (MC1, MC2) on the semiconductor layers 310 and 320 may include a gate insulating layer 322, a charge storage layer 324, a middle gate insulating layer 326 and a gate layer 328.

Each of the ground selection transistors (GST1, GST2) may include a ground selection gate insulating layer 322a, a ground selection lower gate layer 324a, a ground selection middle gate insulating layer 326a, a ground selection upper gate layer 328a and a ground selection butting contact 329a.

Each of the string selection transistors (SST1, SST2) may include a string selection gate insulating layer 322b, a string selection lower gate layer 324b, a string selection middle gate insulating layer 326b, a string selection upper gate layer 328b and a string selection butting contact 329b.

Hereinafter, exemplary operating methods of the memory device of FIG. 1 will be compared with that of the comparative memory device of FIG. 9.

Referring to Table 1, and FIGS. 1 and 2, an exemplary operating method of the exemplary memory device 10 illustrated in FIG. 1 will be described.

TABLE 1

| Signal | ① ground selection line program | ② word line program | erase |
|---|---|---|---|
| selected word line | V pass or 0 V | Vpgm2 | 0 V |
| non-selected word line | V pass or 0 V | Vpass | floating |
| selected bit line (0) | Vcc or 0 V | 0 V | floating |
| non-selected bit line (1) | 0 V | Vcc | floating |
| string selection line | Vcc or 0 V | Vcc | floating |
| ground selection line | V pgm1 | 0 V | 0 V |
| common source line | 0 V | 0 V | floating |
| semiconductor layer (p-well) | 0 V | 0 V | Verase |

A memory cell to be programmed by storing charges may be defined as a selected memory cell (MCsel). In Table 1, a word line associated with the selected memory cell may be defined as a selected word line. Word lines besides the selected word line may be defined as a non-selected word line. A bit line associated with the selected memory cell may be defined as a selected bit line. Bit lines besides the selected bit line may be defined as a non-selected bit line. The selected memory cell may be included in a first memory array layer 100 or a second memory array layer 200. As discussed above, embodiments may include a cell string including memory cell transistors disposed in series between a ground selection line and a string selection line. Each of the memory cells transistors of the cell string may be associated with a respective one of the word lines WL. A cell string including a selected memory cell transistor may be defined as a selected string. Strings besides the selected cell string may be defined as a non-selected cell string.

Exemplary operating methods for the first memory array layer 100 will be described below.

According to a first exemplary programming method employable for programming the memory device 10 of FIG. 1, all of first ground selection transistors ($GST1_1$, $GST1_2$, ... $GST1_n$) disposed at an intersection of a first ground selection line (GSL1) and cell strings may be preferentially programmed. For instance, Vpass (e.g., 8V) or 0V may be applied to first word lines ($WL_{1,1}$, $WL_{1,2}$ ... $WL_{1,n}$) and 0V may be applied to bit lines (BL1, BL2, ... BLm). At this time, Vpgm1 (e.g., about 12V through 18V) may be applied to a first ground selection line (GSL1), Vcc (e.g., 2.5V) or 0V may be applied to a first string selection line (SSL1), and 0V may be applied to a common source line (CSL) and a well of a first semiconductor layer 110. And then, a selected memory cell (MCsel) may be programmed. Vpgm2 (e.g., 18V) may be applied to a selected word line ($WL_{1,1}$), Vpass may be applied to non-selected word lines ($WL_{1,2}$ ... $WL_{1,n}$), 0V may be applied to a selected bit line (BL2), and Vcc may be applied to non-selected bit lines (BL1, BL3 ... BLm). At this time, Vcc may be applied to a first string selection line (SSL1) and 0V may be applied to a first ground selection line (GSL1), a common source line (CSL) and a well of the first semiconductor layer 110. The first ground selection transistors ($GST1_1$, $GST1_2$, ... $GST1_n$) may be programmed to increase an electric potential of an active region where the first ground selection transistors ($GST1_1$, $GST1_2$, ... $GST1_n$) are disposed, thereby preventing a leakage current to a common source line (CSL). Although the first ground selection transistors ($GST1_1$, $GST1_2$, ... $GST1_n$) are not completely programmed, a leakage current may be prevented. Vpgm1 may be equal to or smaller than Vpgm2.

According to a second exemplary programming method employable for programming the memory device 10 of FIG. 1, the first ground selection line (GSL1) and the first ground selection transistors ($GST1_1$, $GST1_2$, ... $GST1_n$) of non-selected strings ($S1_1$, $S1_3$, ... $S1_n$) may be preferentially programmed. For instance, Vpass or 0V may be applied to the first word lines ($WL_{1,1}$, $WL_{1,2}$ ... $WL_{1,n}$), 0V may be applied to non-selected bit lines (BL1, BL3 ... BLm) and Vcc may be applied to the selected bit line (BL2). Vpgm1 may be applied to the first ground selection line (GSL1), Vcc or 0V may be applied to the first string selection line (SSL1) and 0V may be applied to the common source line (CSL) and the well of the first semiconductor layer 110. And then, the selected memory cell (MCsel) may be programmed. Vpgm2 may be applied to the selected word line ($WL_{1,1}$), Vpass may be applied to the non-selected word lines ($WL_{1,2}$ ... $WL_{1,n}$), 0V may be applied to the selected bit line (BL2) and Vcc may be applied to the non-selected bit lines (BL1, BL3 ... BLm). At this time, 0V may be applied to the first ground selection line (GSL1), the common source line (CSL) and the well of the first semiconductor layer 110. Vpgm1 may be equal to or smaller than Vpgm2.

0V may be applied to the selected word line ($WL_{1,1}$) and the first ground selection line (GSL1), and Verase (e.g., 19V) may be applied to the well of the first semiconductor layer 110 to erase data stored in the selected memory cell transistor (MCsel) and the first ground selection transistors ($GST1_1$, $GST1_2$, ... $GST1_n$). At this time, the remaining lines may be floated.

A memory cell of the second memory array layer 200 may be programmed by the exemplary programming methods described above.

Referring to Table 2 and FIGS. 9 and 10, a first comparative operating method of the comparative memory device of FIG. 9 will be described.

TABLE 2

| Signal | word line program | erase |
|---|---|---|
| selected word line | V pgm | 0 V |
| non-selected word line | V pass | floating |
| selected bit line (0) | 0 V | floating |
| non-selected bit line (1) | Vcc | floating |
| string selection line | Vcc | floating |
| ground selection line | 0 V | floating |

TABLE 2-continued

| Signal | word line program | erase |
|---|---|---|
| common source line | 0 V | floating |
| semiconductor layer (p-well) | 0 V | Verase |

A memory cell to be programmed by storing charges may be defined as a selected memory cell transistor (MCsel). In Table 2, a word line associated with the selected memory cell may be defined as a selected word line. Word lines besides the selected word line may be defined as a non-selected word line. A bit line associated with the selected memory cell may be defined as a selected bit line. Bit lines besides the selected bit line may be defined as a non-selected bit line. The selected memory cell may be included in a first memory array layer 301 or a second memory array layer 302.

A comparative operating method for the first memory array layer 301 will be described below.

When a programming operation is applied to a selected memory cell transistor (MCsel), Vpgm may be applied to a selected word line ($WL_{1,1}$), Vpass may be applied to non-selected word lines ($WL_{1,2}$, ... $WL_{1,n}$), 0V may be applied to a selected bit line (BL2), and Vcc may be applied to non-selected bit lines (BL1, BL3 ... BLm). At this time, Vcc may be applied to a string selection line (SSL1) and 0V may be applied to a ground selection line (GSL1), a common source line (CSL) and a well region of a first semiconductor layer 310.

0V may be applied to the selected word line ($WL_{1,1}$) and Verase may be applied to the well region of the first semiconductor layer 310 to erase data stored in the selected memory cell transistor (MCsel). At this time, the remaining lines may be floated.

A memory cell of the second memory array layer 302 may be programmed by the comparative method described above with regard to the first memory array layer 301.

Referring to Table 3 and FIGS. 9 and 10, a second comparative operating method of the comparative memory device of FIG. 9 will be described below.

TABLE 3

| Signal | word line program | erase |
|---|---|---|
| selected word line | V pgm | 0 V |
| non-selected word line | V pass | floating |
| selected bit line (0) | 0 V | floating |
| non-selected bit line (1) | Vcc | floating |
| string selection line | Vcc | floating |
| ground selection line | 0 V | floating |
| common source line | 1.2 V | floating |
| semiconductor layer (p-well) | 0 V | Verase |

A memory cell to be programmed by storing charges may be defined as a selected memory cell (MCsel). In the Table 3, a word line including the selected memory cell may be defined as a selected word line. Word lines besides the selected word line may be defined as a non-selected word line. A bit line including the selected memory cell may be defined as a selected bit line. Bit lines besides the selected bit line may be defined as a non-selected bit line. The selected memory cell may be included in a first memory array layer 301 or a second memory array layer 302.

A second comparative operating method for the first memory array layer 301 will be described below.

When a programming operation is applied to the selected memory cell transistor (MCsel), Vpgm may be applied to the selected word line (WL$_{1,1}$), Vpass may be applied to the non-selected word lines (WL$_{1,2}$, ... WL$_{1,n}$), 0V may be applied to the selected bit line (BL2) and Vcc may be applied to the non-selected bit lines (BL1, BL3 ... BLm). At this time, Vcc may be applied to the string selection line (SSL1), 1.2V may be applied to the common source line (CSL) and 0V may be applied to the first ground selection line (GSL1) and the well region of the first semiconductor layer 310.

0V may be applied to the selected word line (WL$_{1,1}$) and Verase may be applied to the well region of a first semiconductor layer 310 to erase data stored in the selected memory cell transistor (MCsel). The remaining lines may be floated.

A memory cell of the second memory array layer 302 may be programmed by the second comparative method described above with regard to the first memory layer 301.

Figure 11:
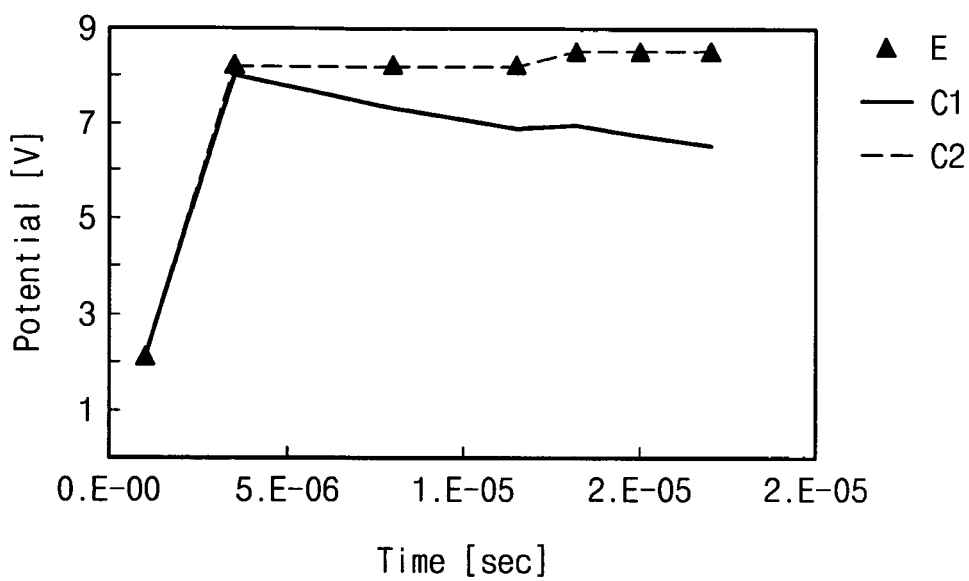
FIG. 11 illustrates a graph of a status of a channel boosting effect on potential in the comparative example of FIG. 9 and the exemplary embodiment of FIG. 1.
Figure 12:
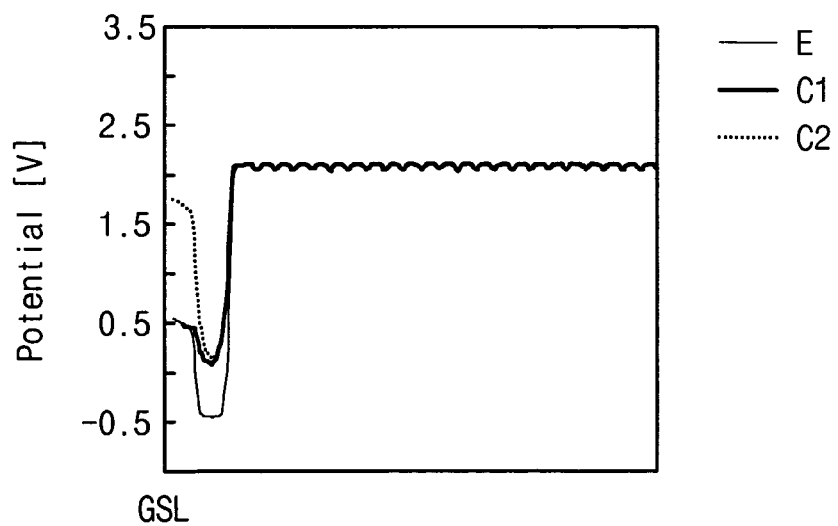
FIG. 12 illustrates a graph of a potential of a cell string of the comparative example of FIG. 9 and the exemplary embodiment of FIG. 1.

Referring to FIGS. 11 and 12, electric characteristics of the memory device 10 of FIG. 1 and the comparative device of FIG. 9 will be described below. FIG. 11 illustrates a graph of a status of a channel boosting effect on potential in the comparative example of FIG. 9 and the exemplary embodiment of FIG. 1. FIG. 12 illustrates a graph of a potential of a cell string of the comparative example of FIG. 9 and the exemplary embodiment of the memory cell 10 of FIG. 1.

When the selected memory cell transistor (MCsel) is programmed, an electric potential of an active region, where cell strings including non-selected memory cells are disposed, may increase by self-boosting.

Referring to FIG. 11, when increasing an electric potential of the memory device 10 using the first and second exemplary embodiments of programming methods (E), the increase in electric potential may be maintained. When increasing an electric potential of the comparative memory device of FIG. 9 using the second comparative operating method (C2), the increase in electric potential may be maintained.

In contrast, when increasing an electric potential of the comparative memory device of FIG. 9 using the first comparative operating method (C1), the electric potential may gradually decrease, i.e., the increase in potential may not be maintained. Such a decrease in electric potential may show that current is leaking from a self boosted active region to a common source line in the comparative memory device that is programmed according to the first comparative operating method (C1).

In the graph of FIG. 12, an x axis represents a progressing direction of a cell string (S) from a ground selection line (GSL) to a string selection line (SSL).

Referring to FIG. 12, the first and second exemplary programming methods described above may be applied to, e.g., the exemplary memory device 10 of FIG. 1 to increase an electric potential of the ground selection line (GSL) and the first and second comparative methods may be applied to, e.g., the comparative memory device of FIG. 10. By increasing the electric potential of the ground selection line, the ground selection line (GSL) may function as a barrier against a leakage current generated from the cell string. That is, a leakage current from a self boosted active region to the common source line (CSL) may be reduced by the barrier.

However, if using the second comparative operating method (C2), threshold voltages of transistors in the memory device of FIG. 9 may be out of a predetermined distribution.

More particularly, referring to FIG. 9, if a voltage of the common source line (CSL) increases, a voltage of a P-well in the second semiconductor layer 320 may increase together because the source contact 350 is disposed to penetrate the second semiconductor layer 320. That is, threshold voltages of transistors in the memory device may be affected.

In the exemplary embodiment of FIG. 1, while the source contact 250 may penetrate the second semiconductor layer 210, a leakage current from the common source line may be reduced and/or prevented because the ground selection transistor (GST2) may be programmed to increase an electric potential of the active region.

Figure 13:
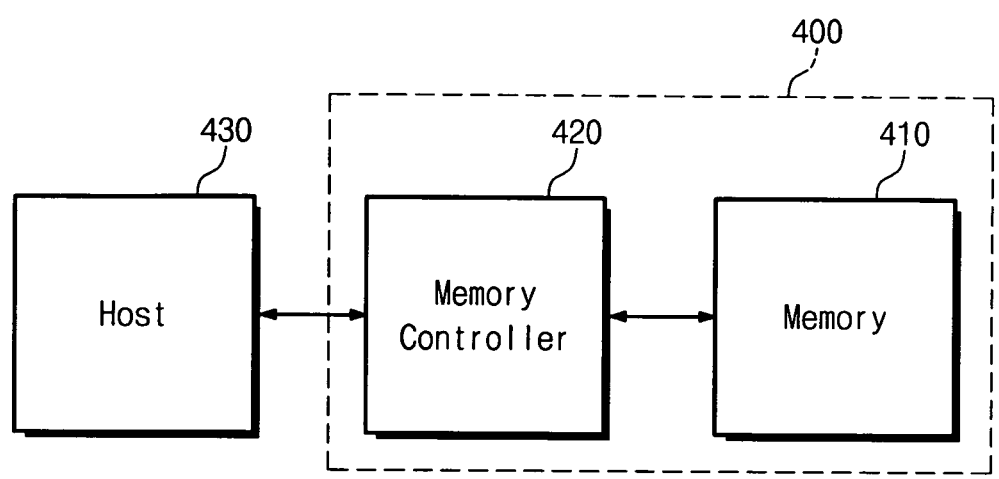
FIG. 13 illustrates a block diagram of a memory system including the exemplary memory device of FIG. 1.

FIG. 13 illustrates a block diagram of a memory system including the memory device of FIG. 1.

A memory system 400 may include a memory device 410 for storing a relatively large amount of data and a memory controller 420. The memory controller 420 may control the memory device 410 to read stored data from the memory device 410 or to write stored data to the memory device 410 in response to a read/write request from a host 430. The memory controller 420 may constitute an address mapping table for mapping an address provided from the host 430 (a mobile device or a computer system) into a physical address of the memory device 410.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing exemplary embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present. Like reference numerals refer to like elements throughout the specification.

Spatially relatively terms, such as "beneath," "below," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented (rotated 90 degrees or at other orientations) and the spatially relative descriptors used herein interpreted accordingly. As used herein, "height" refers to a direction that is generally orthogonal to the faces of a substrate.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A memory device, comprising:
    a first ground selection transistor;
    a first string selection transistor; and
    first memory cell transistors disposed in series between the first ground selection transistor and the first string selection transistor, wherein the first ground selection transistor and the first memory cell transistors have a same structure.

2. The memory device as claimed in claim 1, wherein the first memory cell transistors and the first ground selection transistor include a first gate insulating layer, a first charge storage layer, a first middle gate insulating layer and a first gate layer, respectively.

3. The memory device as claimed in claim 1, wherein the first ground selection transistor, the first string selection transistor and the first memory cell transistors correspond to a first memory array layer,
    wherein the memory device further includes a second memory array layer above the first memory array layer, the second memory array layer including a second ground selection transistor, a second string selection transistor and second memory cell transistors disposed in series between the second ground selection transistor and the second string selection transistor, and
    wherein the second ground selection transistor and the second string selection transistor have a same structure.

4. The memory device as claimed in claim 3, wherein the second memory cell transistors and the second ground selection transistor include a second gate insulating layer, a second charge storage layer, a second middle gate insulating layer and a second gate layer.

5. The memory device as claimed in claim 3, wherein the first string selection transistor and the second string selection transistor include a gate insulating layer and a gate layer.

6. The memory device as claimed in claim 3, further comprising:
    a bit line electrically connected to a drain of the first string selection transistor and a drain of the second string selection transistor, the bit line being disposed above the second memory array layer; and
    a common source line that electrically connects a first common source region of the first ground selection transistor to a second common source region of the second ground selection transistor.

7. The memory device as claimed in claim 6, further comprising a source contact connecting the first common source region and the second common source region, wherein the source contact penetrates a body of the second memory array layer.

* * * * *